(12) United States Patent
Pasotti et al.

(10) Patent No.: US 11,342,031 B2
(45) Date of Patent: May 24, 2022

(54) CIRCUIT AND METHOD FOR PROCESS AND TEMPERATURE COMPENSATED READ VOLTAGE FOR NON-VOLATILE MEMORY

(71) Applicants: STMICROELECTRONICS S.R.L., Agrate Brianza (IT); STMICROELECTRONICS INTERNATIONAL N.V., Geneva (CH)

(72) Inventors: Marco Pasotti, Travaco' Siccomario (IT); Dario Livornesi, Paderno Dugnano (IT); Roberto Bregoli, Offlaga (IT); Vikas Rana, Noida (IN); Abhishek Mittal, Ghaziabad (IN)

(73) Assignees: STMicroelectronics S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/006,510

(22) Filed: Aug. 28, 2020

(65) Prior Publication Data
US 2022/0068400 A1    Mar. 3, 2022

(51) Int. Cl.
| | |
|---|---|
| G11C 13/00 | (2006.01) |
| G11C 7/02 | (2006.01) |
| G11C 16/26 | (2006.01) |
| G11C 7/06 | (2006.01) |
| G11C 7/14 | (2006.01) |
| G11C 16/34 | (2006.01) |
| G11C 16/08 | (2006.01) |
| G06F 12/00 | (2006.01) |

(52) U.S. Cl.
CPC .............. *G11C 16/26* (2013.01); *G11C 16/08* (2013.01); *G11C 16/3427* (2013.01); *G06F 12/00* (2013.01); *G11C 7/14* (2013.01)

(58) Field of Classification Search
CPC ...... G11C 16/26; G11C 16/08; G11C 16/3427
USPC ........................................ 365/185.02
See application file for complete search history.

(56) References Cited

U.S. PATENT DOCUMENTS

| | | | |
|---|---|---|---|
| 4,435,793 A | 3/1984 | Ochii | |
| 5,473,568 A | 12/1995 | Okamura | |
| 7,277,342 B2 | 10/2007 | Sumitani et al. | |
| 2007/0140003 A1* | 6/2007 | Ido | G11C 8/08 365/185.2 |

(Continued)

OTHER PUBLICATIONS

Amrutur et al., "A Replica Technique for Wordline and Sense Control in Low-Power SRAM's", IEEE Journal of Solid-State Circuits, vol. 33(8), Aug. 1998, pp. 1208-1219.

*Primary Examiner* — Ly D Pham
(74) *Attorney, Agent, or Firm* — Seed IP Law Group LLP

(57) ABSTRACT

An integrated circuit includes a memory array and a read voltage regulator that generates read voltages from the memory array. The read voltage regulator includes a replica memory cell and the replica bitline current path. The replica memory cell is a replica of memory cells of the memory array. The replica bitline current path is a replica of current paths associated with deadlines of the memory array. The read voltage regulator generates a read voltage based on the current passed through the replica bitline current path. This read voltage is then supplied to the wordlines of the memory array during a read operation.

17 Claims, 3 Drawing Sheets

(56) References Cited

U.S. PATENT DOCUMENTS

| | | | | |
|---|---|---|---|---|
| 2011/0075473 A1* | 3/2011 | Park | .................... | G11C 13/004 |
| | | | | 365/163 |
| 2012/0155157 A1* | 6/2012 | Oh | .................... | G11C 11/1675 |
| | | | | 365/158 |
| 2014/0104925 A1* | 4/2014 | Azuma | ................ | G11C 13/004 |
| | | | | 365/148 |
| 2015/0243352 A1* | 8/2015 | Park | .................... | G11C 11/5642 |
| | | | | 365/163 |
| 2020/0090745 A1* | 3/2020 | Gangasani | ......... | G11C 13/0033 |

\* cited by examiner

CIRCUIT AND METHOD FOR PROCESS AND TEMPERATURE COMPENSATED READ VOLTAGE FOR NON-VOLATILE MEMORY

BACKGROUND

Technical Field

The present disclosure is related to non-volatile memories, and more particularly to a read voltage regulator for a non-volatile memory.

Description of the Related Art

In non-volatile memories, read operations are based on current sensing. However, the relationship between current and voltage can lead to problems during the read operation. If an appropriate bitline voltage is not present during a read operation, then a faulty read operation may occur and may change the data stored in memory cell. One possible cause of faulty read operations can be the voltage drop across column decoding transistors through which the bitline current flows. The voltage drop across the transistors can limit the current flowing through the memory cell. The variations may occur due to factors present during manufacture/processing of the memory or due to changes in temperature during operation.

BRIEF SUMMARY

Principles of the present disclosure help ensure that a memory operates properly in spite of variations in temperature or manufacturing processes. A read voltage regulator generates a read voltage that drives the wordlines of the memory array during read operations. The read voltage compensates for temperature and process variations and ensures that the read voltage will result in a properly performed read operation.

The read voltage regulator includes a replica memory cell and a replica bitline current path. The replica memory cell is a replica of the memory cells of the memory array. The replica bitline current path is a replica of the bitline current paths of the memory array including column decoding transistors, memory cells and ground path transistors. The read voltage regulator includes an amplifier that is coupled to a data storage node of the replica memory array, to an intermediate point on the bitline current path, and to a reference voltage. The amplifier is connected in a feedback configuration that ensures that the proper read voltage is generated and that the proper bitline voltage is generated to bias the bitlines of the current paths regardless of variations in temperature and process.

The replica bitline current path includes transistors that are identical to the transistors in the bitline current paths of the memory array. The voltage drops across the transistors in the replica bitline current path will be the same as the voltage drops across the transistors in the bitline current paths for a given current. Accordingly, if there are unexpectedly high voltage drops across any of the transistors in the replica bitline current path, the feedback configuration of the amplifier will take these into account and generate an appropriate read voltage for the read operations.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known algorithms associated with facial recognition, facial detection, and facial authentication have not been shown or described in detail, to avoid unnecessarily obscuring descriptions of the embodiments. Further, well-known structures associated with the time of flight sensor and inertial measurement units have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
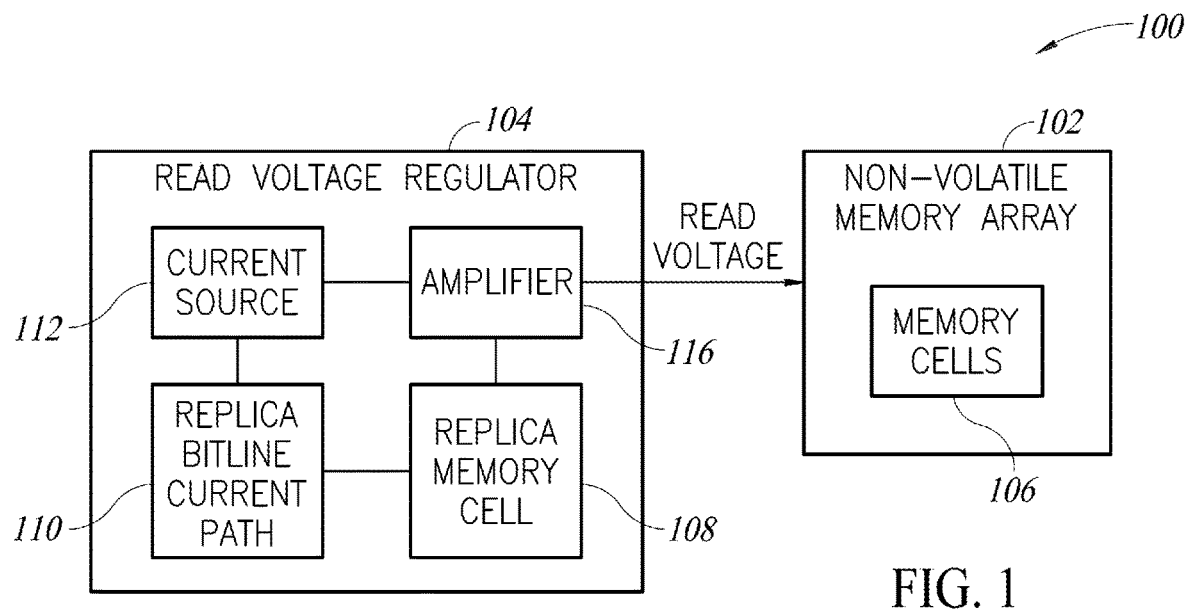
FIG. 1 is a block diagram of an integrated circuit, according to one embodiment.

FIG. 1 is a block diagram of an integrated circuit 100, according to one embodiment. The integrated circuit 100 includes a nonvolatile memory array 102 and a read voltage regulator 104. The nonvolatile memory array 102 includes a plurality of memory cells 106. As is set forth in more detail below, the read voltage regulator 104 generates a read voltage that can reliably drive an adequate current through bitlines of the nonvolatile memory array 102 even when there are variations in temperature or process.

The read voltage regulator 104 includes a replica memory cell 108, a replica bitline current path 110, the current source 112, and an amplifier 116. The components of the read voltage regulator 104 cooperate to generate a read voltage that is used to bias the wordlines of the nonvolatile memory array 102. The read voltage is generated in such a manner that a read current of sufficient magnitude can be reliably driven through the bitlines of the nonvolatile memory array 102 during memory read operations of the memory cells 106.

The memory cells 106 include floating gate transistors. The floating gate transistors have floating gates. Data is stored in or erased from the floating gates by driving a write current or and erase current through the channel region of the floating gate transistors. Electrons tunnel through the channel to the floating gate or from the floating gate to the channel as the case may be to store data or erase data from the floating gate. The tunneling process is known as Fowler-Nordheim tunneling. While the present disclosure primarily describes embodiments in which the memory cells 106 include floating gate transistors as storage devices, other types of nonvolatile memory cells can be utilized without departing from the scope of the present disclosure. Furthermore, principles of the present disclosure can extend to memory arrays other than non-volatile memory arrays.

The nonvolatile memory array 102 includes a plurality of bitlines and wordlines (not shown in FIG. 1). The memory cells 106 are arranged in rows and columns. Each bitline is coupled to a column of memory cells 106. Each wordline is coupled to a row of memory cells 106. Data can be read from a memory cell by selecting the wordline associated with the row of the memory cell and by selecting the bitline associated with the column of the memory cell. Data is read from the memory cell 106 by passing a read current through the selected bitline. In order to drive the read current through the selected bitline, a read voltage is applied to the corresponding wordline. The read voltage turns on a selection transistor that enables a current to be driven through the bitline.

Data is read from the nonvolatile memory cell 106 by sensing the current that is driven through the bitline. Though not shown in FIG. 1, the integrated circuit 100 includes sense amplifiers that sense the current through the bitline. The value of the current flowing to the bitline is based, in part, on the value of the data stored in the memory cell. Accordingly, the sense amplifiers can sense the data value stored in the memory cell based on the read current flowing through the bitline.

The voltage on the bitline also plays a role in a proper read operation. If the voltage on the bitline is too high or too low, it is possible that a faulty read operation may occur. If the bitline voltage is very high a read-disturb issue can occur in the memory. On the other hand, if the bitline voltage is too low then the current through the memory cell may be limited, resulting in a wrong-read operation. The voltage on the bitline can vary based on other components included in the bitlines current path. The bitline has a current path that includes not only the bitline itself, but the transistors of the sense amplifiers and column decoding transistors upstream from the bitline, and source lines transistors downstream from the bitline. The source line transistors pass the bitline current to ground. The bitline current path is coupled between the supply voltage VDD and ground. Accordingly, the voltage on the bitline is based, in part, on the voltage drop across the various aforementioned transistors in the bitline current path. If the voltage drop across the column decoding transistors is higher than expected, is possible that the bitline will have a voltage that is undesirably low for a proper read operation.

There are various factors that can result in undesirably high voltage drops across column decoding transistors. For example, as temperature increases so does the resistance of the transistors when conducting or "on". The increased resistance results in an increased voltage drop. Another possible factor is variations in the fabrication process of the integrated circuit 100. Fabrication process variations can result in the column decoding transistors having a higher than expected resistance or threshold voltage and corresponding voltage drop when conducting. If the read voltage supplied to the wordline is fixed, then variations in temperature or process will not be addressed and faulty read operations can occur. The read voltage regulator 104 overcome these possible drawbacks by generating a read voltage that takes into account variations in temperature or process.

The read voltage regulator 104 includes a replica memory cell 108. The replica memory cell 108 includes a replica of the transistors of the memory cells 106. Though the replica memory cell 108 is described as being a "replica" of the memory cells 106, in practice the replica memory cell 108 may include some additional electrical connections not present in the memory cells 106 in order to assist in generating the read voltage. For example, the replica memory cell may include a data storage transistor in which the floating gate is shorted to a control gate. In the memory cells 106, the floating gate will not be shorted to the control gate. Nevertheless, the replica memory cell 108 in most respects is a copy of the memory cells 106.

The read voltage regulator 104 includes a replica bitline current path 110. The replica bitline current path 110 replicates the bitline current paths associated with the bitlines of the nonvolatile memory array 102. The replica bitline current path 110 can include replica sense amplifier transistors, replica column decoding transistors, and replica source line transistors. The replica bitline current path replicates the bitline current paths of the nonvolatile memory array 102 so that the voltage drop across the various transistors of the bitline current paths can be replicated in the replica bitline current path. As will be described in more detail below, this can assist in generating the read voltage in a way that reliably compensates for variations in temperature and process.

The read voltage regulator 104 includes a current source 112. The current source 112 drives a current through the bitline current path 110 that replicates the currents that will be driven through the bitlines of the non-volatile memory array 102. This assists in generating the read voltage in a way that compensates for variations in temperature or process.

The voltage regulator 104 includes an amplifier 116 coupled to the replica memory cell 108, and the replica bitline current path 110. The amplifier 116 generates the read voltage and supplies the read voltage to the wordlines of the nonvolatile memory array 102. The amplifier 116 may be coupled to a data storage node of the replica memory cell 108. The amplifier 116 may be coupled to an intermediate point in the replica bitline current path. The intermediate point may provide a voltage indicative of the voltage drop across one or more transistors associated with the replica bitline current path 110. The amplifier 116 may also be coupled to a reference voltage.

In one embodiment, the amplifier 116 is an operational amplifier. The output of the amplifier 116 is coupled to the data storage node of the replica memory cell 108 via one or more resistors. An inverting input of the operational amplifier is coupled to the intermediate point of the replica bitline current path 110 as described previously. A noninverting input of the operational amplifier is coupled to a reference voltage. The couplings of the operational amplifier result in the output of the operational amplifier generating a read voltage that can drive a sufficient current through the bitline current paths of the nonvolatile memory array 102 to ensure that the voltage at the bitlines is in a desired range.

Figure 2:
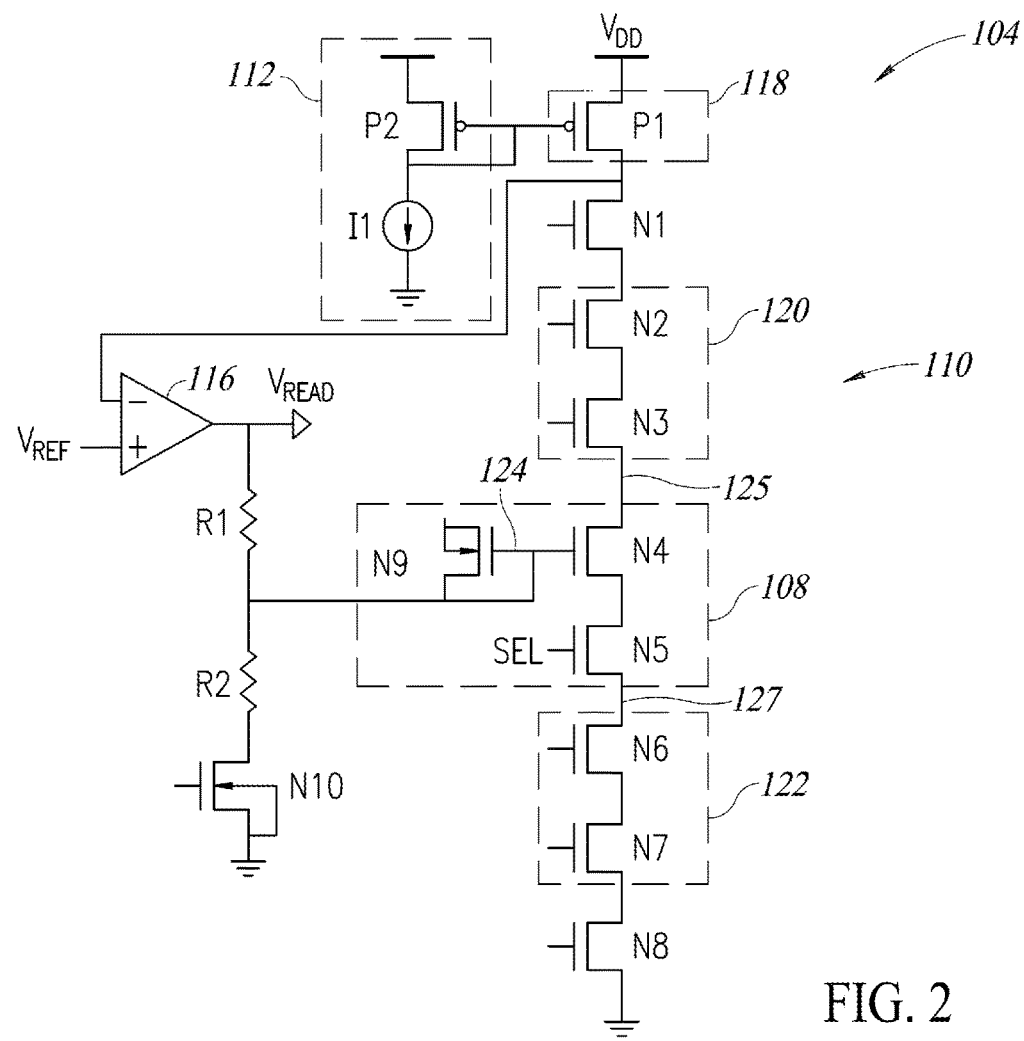
FIG. 2 is a schematic diagram of a read voltage regulator, according to one embodiment.

FIG. 2 is a schematic diagram of a read voltage regulator 104, according to one embodiment. The schematic diagram of FIG. 2 is one example of a read voltage regulator 104 as described in relation to FIG. 1. Other circuit schematics can be utilized for the read voltage regulator 104 without departing from the scope of the present disclosure.

The voltage regulator 104 includes a replica memory cell 108. The replica memory cell 108 includes NMOS transistors N4, N5, and N9. The transistors N4 and N9 correspond to the floating gate transistor of a memory cell 106 of the nonvolatile memory array 102. The gate of the transistor N9 represents the floating gate of the memory cell. The gate of the transistor N4 represents the control gate of the memory cell. In this case, the control gate and the floating gate are shorted together. This is different than the floating gate transistors of the memory cells 106 of the memory array 102. Nevertheless, the channel, source, and drain of the transistor N4 is an accurate replica of the channel, source, and drain of the floating gate transistors of the memory cells 106. The shorted floating gate and control gate of the transistors N4 and N9 represents a data storage node 124 of the replica memory cell 108. The transistor N9 acts as a capacitor.

The voltage regulator 104 includes a replica bitline current path 110. The replica bitline current path 110 includes a replica sense amplifier current path 118. The replica sense amplifier current path 118 includes a PMOS transistor P1. The PMOS transistor P1 is a replica of a PMOS transistor of sense amplifiers associated with the memory array 102.

The replica bitline current path 110 also includes an NMOS cascode transistor, N1. The transistor N1 receives a cascode voltage on its gate terminal. The cascode voltage is generated by a cascode voltage regulator, not shown. The cascode voltage is selected to assist in generating a proper voltage at the replica bitline 125 of the replica bitline current path 110.

The replica bitline current path 110 includes replica column decoding current path 120. The replica column decoding current path 120 includes replica column decoding NMOS transistors N2 and N3. The transistors N2 and N3 are replicas of column decoding transistors in the bitline current paths of the memory array 102. In practice, there may be more or fewer column decoding transistors than are shown in FIG. 2.

The replica bitline current path 110 also includes a replica source line current path 122. The replica source line current path includes NMOS transistors N6 and N7. The transistors N6 and N7 are replicas of the transistors in the source line current path of the bitline current paths associated with the memory array 102. The source line current path 122 may also include the NMOS transistor N8. Alternatively, the transistor N8 may be considered a source line discharge transistor that selectively enables the bitline current path to be discharged through ground. The replica bitline current path 110 also includes the source line 127.

A read current can be passed through the bitline current path 110. The transistors P1 and N1-N8 are connected in series with each other such that the bitline current passes through the source and drain of each of the transistors P1 and N1-N8 between the supply voltage VDD and ground.

The read voltage regulator 104 includes a current source 112. The current source 112 includes a PMOS transistor P2 and current source I1 coupled to the drain terminal of the PMOS transistor P2. The current source I1 generates a current that passes from VDD through the transistor P2 to ground. The current source 112 is coupled to the sense amplifier transistor P1 in a current mirror configuration. In particular, the gate terminals of the transistors P1 and P2 are coupled together. The gate terminals of the transistors P1 and P2 are also coupled to the drain terminal of the transistor P2. This configuration ensures that the same current driven through the transistor P2 will be driven through the transistor P1, if P1 and P2 are identical. Accordingly, the current source 112 drives a bitline read current through the bitline current path 110.

The read voltage regulator 104 includes an operational amplifier 116. The operational amplifier 116 includes a noninverting input that receives a reference voltage Vref. Vref may be generated by reference voltage regulator, such as a bandgap voltage regulator. A bandgap voltage regulator can supply a reference voltage Vref based on a semiconductor bandgap. In this case, Vref does not vary across temperature or process.

The operational amplifier 116 includes inverting input coupled between the drain terminal of the transistor P1 and a drain terminal of the transistor N1. The voltage at the drain terminals of the transistors P1 and N1 is indicative of the voltage drop across the column decoding transistors N2 and N3. Accordingly, the voltage received at the inverting input 116 may be different based on the current temperature or process variations associated with the fabrication of integrated circuit 102.

The operational amplifier 116 includes an output that generates the read voltage Vread. A voltage divider including the resistors R1 and R2 and the NMOS transistor N10 is coupled between the output of the operational amplifier 116 and ground. The data storage node 124 of the replica memory cell 108 is coupled to the midpoint between the resistors R1 and R2. Accordingly, the output of the operational amplifier 116 is coupled to the data storage node of the replica memory cell 108 by the resistor R1.

The operational amplifier 116 generates a read voltage that can drive a current through the bitlines of the memory array 102 sufficient to provide a bitline voltage in a selected range. Because the inverting input of the operational amplifier 116 receives an intermediate voltage from the bitline current path 110 and supplies a voltage that affects the voltage supplied to the gate of the transistor N4, the operational amplifier 116 generates a read voltage that results in a voltage of the bitlines 125, or at the drain terminal of the transistor N4 the falls within a selected range. If this read voltage is applied to the wordlines of the memory array 102, then the voltage at the bitlines of the memory array 102 also fall within the selected range.

Figure 3:
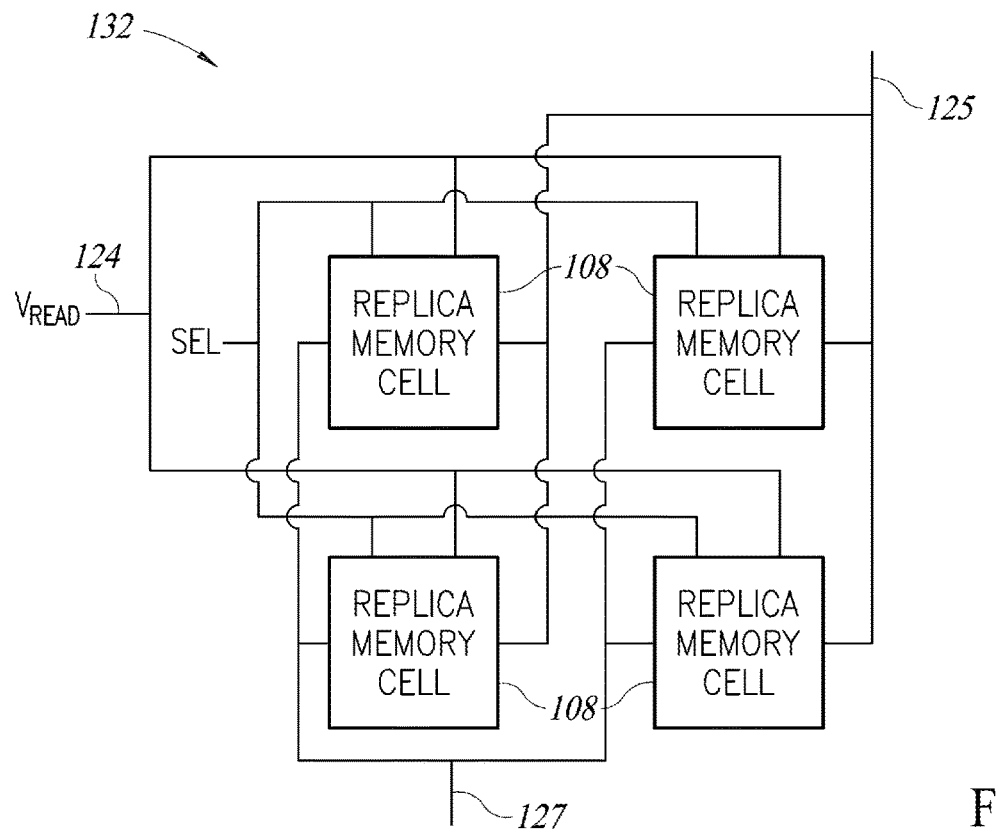
FIG. 3 is a block diagram of a replica memory array of a read voltage regulator, according to one embodiment.

FIG. 3 is a block diagram of a replica memory array 132, according to one embodiment. The replica memory array 132 includes replica memory cells 108. Each replica memory cell 108 corresponds to the memory cell 108 shown in FIG. 2. The replica memory array 132 includes a 2×2 array of replica memory cells 108. The bitlines 125 and source lines 127 of the replica memory array 132 are shorted together. In practice, the replica memory cell 108 of FIG. 2 includes an array of replica memory cells connected as shown in FIG. 3. This ensures that if any of the replica memory cells 108 are faulty, there will be at least one or more other replica memory cells 108 that function properly. Accordingly, this is a failsafe that ensures a properly functioning read voltage regulator 104.

In one embodiment, the replica memory array 132 includes six rows and six columns of replica memory cells 108. Thus, each of the six bitlines 125 will be shorted together. Each of the six source lines 127 will be shorted together. Each of the six wordlines will be shorted together. The bitline selection transistors (see transistor N5 in FIG. 2) receive a selection voltage SEL. The selection voltage SEL is the supply voltage VDD. The wordlines receive the read voltage Vread. In one embodiment, the replica memory array 132 may include a plurality of dummy memory cells surrounding the array of replica memory cells 108.

Figure 4:
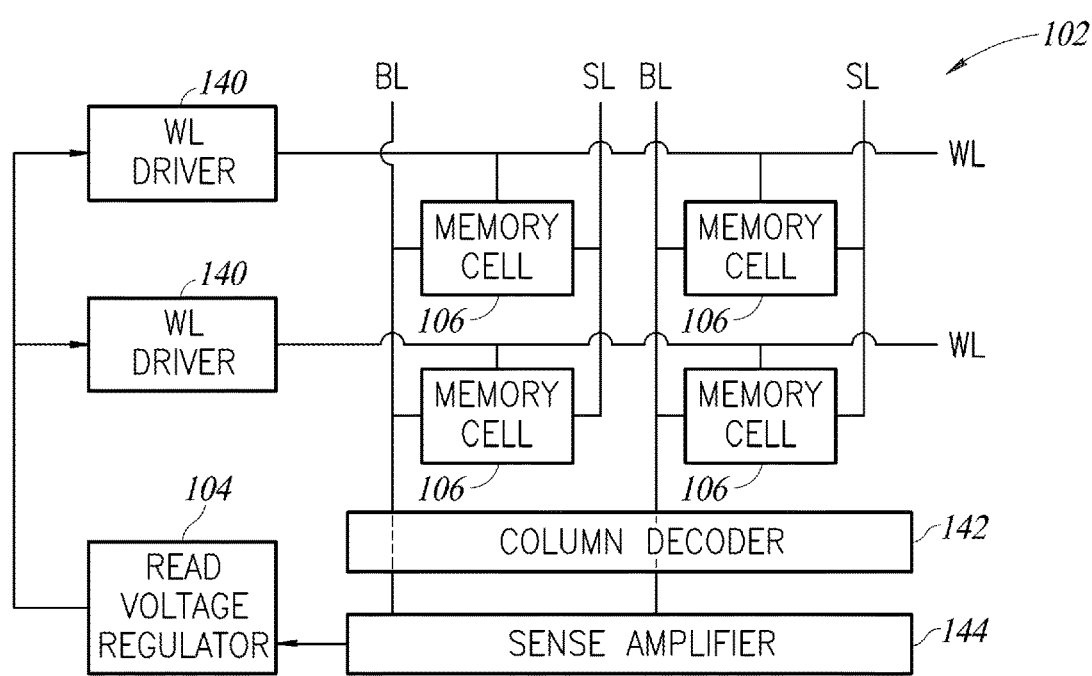
FIG. 4 is a block diagram of an integrated circuit, according to one embodiment.

FIG. 4 is a block diagram of a memory array 102, according to one embodiment. The memory array 102 includes two columns and two rows of memory cells 106. In practice, the memory array 102 may include hundreds or thousands of rows and columns. A bitline BL and a source line SL are coupled to each column of memory cells 106. A wordline WL is coupled to each row of memory cells 106. Each wordline WL is coupled to a wordline driver 140. The read voltage regulator 104 supplies the read voltage to the wordline drivers 140. The wordline drivers 140 supply the read voltage Vread to the wordlines WL.

Each memory cell 106 may include a floating gate transistor. The floating gate transistor includes a floating gate and a control gate. The floating gate transistor of the memory cell 106 corresponds to the transistors N4 and N9 of the replica memory cell, but a single transistor without the floating gate and the control gate shorted together. The floating gate stores data. The control gate is coupled to the wordline and receives the voltage Vread during a read operation. In one example, source terminal of the floating gate transistor is coupled to the source line SL and a drain terminal of the floating gate transistor is coupled to the drain terminal of the floating gate transistor. Each memory cell 106 may include a selection transistor corresponding to the transistor N5 of the replica memory cell 108. The transistor N5 may receive a selection voltage that enables the read operation. Alternatively, the selection transistor may receive the read voltage. The selection transistor may be coupled between the source terminal of the floating gate transistor and the source line SL.

The memory array 102 includes a column decoder 142 and a sense amplifier 144. The column decoder 142 includes column decoding transistors. The transistors N2 and N3 of the read voltage regulator 104 are replicas of the transistors of the column decoder 142. The memory array 102 includes a sense amplifier 144. The transistor P1 of the read voltage regulator 104 is a replica of the transistors in the sense amplifier 144.

The column decoder 142 is coupled to the source line SL. The sense amplifier 144 is coupled to the bitlines BL. When a memory cell is selected for a read operation, the WL driver supplies the read voltage to the corresponding WL. Accordingly, the WL driver may also include row decoding circuitry for WL selection. The column decoder selects the column of the memory cell for which the read operation will be performed. Current flows from the sense amplifier 144 through the bitline BL of the selected column, through the memory cell, and through the source line SL of the selected column. The read voltage Vread both enables the read operation and ensures that a suitable voltage appears on the bitline.

Figure 5:
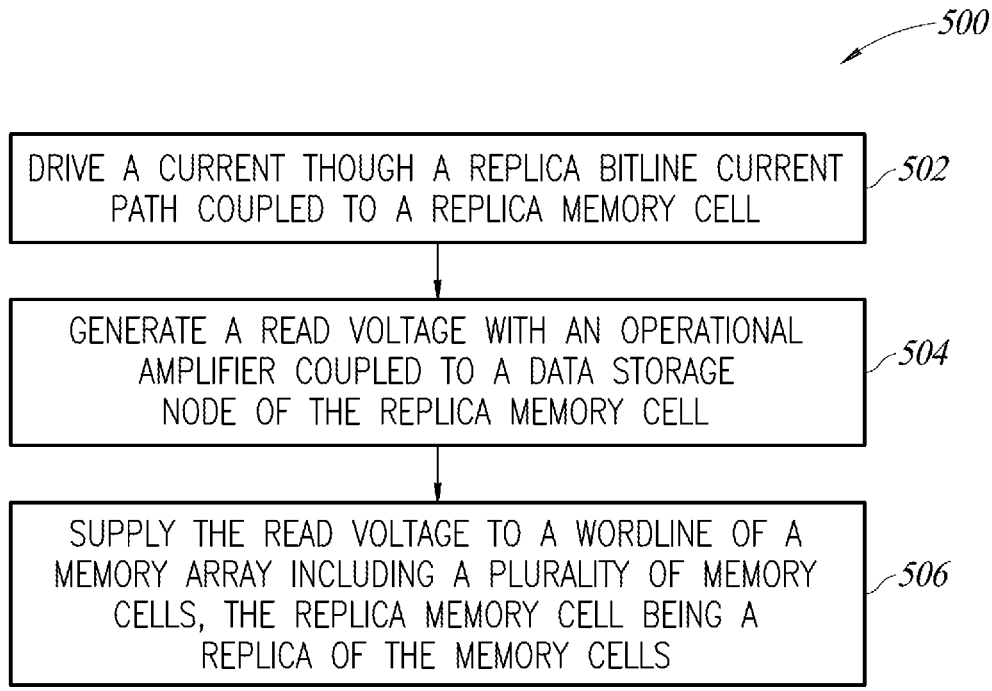
FIG. 5 is a flow diagram of a method for performing read operations for a nonvolatile memory array, according to one embodiment.

FIG. 5 is a flow diagram of a method 500 for operating a memory array, according to one embodiment. At 502, the method 500 includes driving a current through a replica bitline current path coupled to a replica memory cell. At 504, the method 500 includes generating a read voltage with an operational amplifier coupled to a data storage node of the replica memory cell. At 506, the method 500 includes supplying the read voltage to a wordline of a memory array including a plurality of memory cells. The replica memory cell is a replica of the memory cells of the memory array.

In one embodiment, an integrated circuit includes an array of non-volatile memory cells and a read voltage regulator. The read voltage regulator includes a replica memory cell having a data storage node, a replica bitline current path coupled to the memory cell, and a current source configured to drive a current through the replica bitline current path. The read voltage regulator also includes an operational amplifier coupled to the data storage node and the replica bitline current path and configured to generate a read voltage for the array of non-volatile memory cells based on an intermediate voltage of the replica bitline current path.

In one embodiment, a method includes driving a current through a replica bitline current path coupled to a replica memory cell. The method includes generating a read voltage with an operational amplifier coupled to a data storage node of the replica memory cell. The method includes supplying the read voltage to a wordline of a memory array including a plurality of memory cells, the replica memory cell being a replica of the memory cells.

In one embodiment, an integrated circuit includes a non-volatile memory array including a plurality of memory cells, wordlines, and bitlines. The integrated circuit includes a read voltage regulator configured to generate a read voltage and to apply the read voltage to the wordlines of the memory array during a read operation. The read voltage regulator includes a replica memory array having a replica memory cell, a replica bitline coupled to the replica memory array, a replica column decoder transistor in a current path of the replica bitline, and a replica sense amplifier transistor in the current path of the replica bitline. The read voltage regulator includes a current source configured to drive a current trough the current path of the replica bitline and an operational amplifier coupled to a gate terminal of the replica memory cell by one or more resistors and configured to supply the read voltage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An integrated circuit, comprising:
   an array of non-volatile memory cells; and
   a read voltage regulator including:
     a replica memory cell having a data storage node;
     a replica bitline current path coupled to the memory cell and including one or more replica column decoder transistors;
     a current source configured to drive a current through the replica bitline current path; and
     an operational amplifier coupled to the data storage node and the replica bitline current path and configured to generate a read voltage for the array of non-volatile memory cells based on an intermediate voltage of the replica bitline current path.

2. The integrated circuit of claim 1, wherein the read voltage is based, in part, on a voltage drop across the one or more replica column decoder transistors when the current is driven through the replica bitline current path.

3. The integrated circuit of claim 2, wherein the replica bitline current path includes a replica sense amplifier transistor upstream from the replica column decoder transistors.

4. The integrated circuit of claim 3, wherein the operational amplifier includes a first input that receives the intermediate voltage from a drain terminal of the replica sense amplifier transistor.

5. The integrated circuit of claim 4, wherein the operational amplifier includes a second input terminal configured to receive a reference voltage.

6. The integrated circuit of claim 5, wherein the operational amplifier includes an output terminal configured to output the read voltage, the read voltage regulator including a resistor coupled between the output terminal and a data storage node of the replica memory cell.

7. The integrated circuit of claim 3, wherein the replica bitline current path includes a replica source path having a replica source path transistor coupled between the bitline and ground.

8. The integrated circuit of claim 1, wherein the memory array includes:
a plurality of wordlines coupled to the memory cells; and
a plurality of bitline current paths coupled to the memory cells, the replica bitline current path being a replica of the bitline current paths, the replica memory cell is a replica of the memory cells.

9. The integrated circuit of claim 8, wherein the read voltage regulator supplies the read voltage to the wordlines of the memory array during read operations of the memory array.

10. A method, comprising:
driving a current through a replica bitline current path coupled to a replica memory cell;
generating a read voltage with an operational amplifier coupled to a data storage node of the replica memory cell; and
supplying the read voltage to a wordline of a memory array including a plurality of memory cells, the replica memory cell being a replica of the memory cells;
receiving, at a first input terminal of the operational amplifier, a first voltage from an intermediate node of the replica bitline current path; and
receiving, at a second input terminal of the operational amplifier, a second voltage from a reference voltage regulator.

11. The method of claim 10, further comprising passing a second current from an output terminal of the operational amplifier through a resistor coupled between the output terminal and the data storage node.

12. The method of claim 10, wherein driving a current through the replica bitline includes driving the current through a replica sense amplifier transistor and a replica column decoder transistor.

13. An integrated circuit, comprising:
a non-volatile memory array including:
a plurality of memory cells;
a plurality of wordlines; and
a plurality of bitlines; and
a read voltage regulator configured to generate a read voltage and to apply the read voltage to the wordlines of the memory array during a read operation, the read voltage regulator including:
a replica memory array having a replica memory cell;
a replica bitline coupled to the replica memory array;
a replica column decoder transistor in a current path of the replica bitline;
a replica sense amplifier transistor in the current path of the replica bitline; and
an operational amplifier coupled to a gate terminal of the replica memory cell a resistor and configured to supply the read voltage.

14. The integrated circuit of claim 13, wherein the memory cells each include a floating gate transistor.

15. The integrated circuit of claim 14, wherein the replica memory cell includes a transistor having a gate terminal coupled to an output terminal of the operational amplifier.

16. The integrated circuit of claim 15, further comprising a resistor coupled between the output terminal of the operational amplifier and the gate terminal of the transistor of the replica memory cell.

17. The integrated circuit of claim 16, further comprising a reference voltage regulator configured to supply a reference voltage to the operational amplifier.

* * * * *